US009617640B2

(12) United States Patent
Yudovsky et al.

(10) Patent No.: US 9,617,640 B2
(45) Date of Patent: Apr. 11, 2017

(54) APPARATUS AND METHODS FOR INJECTOR TO SUBSTRATE GAP CONTROL

(71) Applicants: Joseph Yudovsky, Campbell, CA (US); Kevin Griffin, Livermore, CA (US); Kaushal Gangakhedkar, San Jose, CA (US)

(72) Inventors: Joseph Yudovsky, Campbell, CA (US); Kevin Griffin, Livermore, CA (US); Kaushal Gangakhedkar, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/435,070

(22) PCT Filed: Feb. 20, 2014

(86) PCT No.: PCT/US2014/017399
§ 371 (c)(1),
(2) Date: Apr. 10, 2015

(87) PCT Pub. No.: WO2014/130673
PCT Pub. Date: Aug. 28, 2014

(65) Prior Publication Data
US 2015/0345022 A1 Dec. 3, 2015

Related U.S. Application Data

(60) Provisional application No. 61/767,777, filed on Feb. 21, 2013.

(51) Int. Cl.
*C23C 16/00* (2006.01)
*C23C 16/52* (2006.01)
(Continued)

(52) U.S. Cl.
CPC .......... *C23C 16/52* (2013.01); *C23C 16/4583* (2013.01); *C23C 16/45544* (2013.01);
(Continued)

(58) Field of Classification Search
CPC ..... C23C 16/46; C23C 16/509; C23C 16/455; C23C 16/00; C23C 16/458; C23C 16/44
See application file for complete search history.

(56) References Cited

U.S. PATENT DOCUMENTS 6,009,827 A 1/2000 Robles et al.
6,821,563 B2 11/2004 Yudovsky et al.
(Continued)

OTHER PUBLICATIONS

Poodt, Paul, et al., High-Speed Spatial Atomic-Layer Deposition of Aluminum Oxide Layers for Solar Cell Passivation, *Adv. Mater.* vol. 22 2010 3564-3567.
(Continued)

*Primary Examiner* — Kelly M Gambetta
(74) *Attorney, Agent, or Firm* — Servilla Whitney LLC

(57) ABSTRACT

Described are apparatus and methods for processing a semiconductor wafer in which the gap between the wafer surface and the gas distribution assembly remains uniform and of known thickness. The wafer is positioned within a susceptor assembly and the assembly is lifted toward the gas distribution assembly using actuators. The wafer can be lifted toward the gas distribution assembly by creating a fluid bearing below and/or above the wafer.

7 Claims, 6 Drawing Sheets

(51) Int. Cl.
*C23C 16/455* (2006.01)
*C23C 16/458* (2006.01)
*H01L 21/66* (2006.01)
*H01L 21/02* (2006.01)
*H01L 21/285* (2006.01)

(52) U.S. Cl.
CPC .... *C23C 16/45551* (2013.01); *H01L 21/0228* (2013.01); *H01L 21/0262* (2013.01); *H01L 21/28556* (2013.01); *H01L 22/10* (2013.01)

(56) References Cited

U.S. PATENT DOCUMENTS

| | | | |
|---|---|---|---|
| 2002/0094260 A1* | 7/2002 | Coomer | H01L 21/6838 |
| | | | 414/416.09 |
| 2006/0054090 A1 | 3/2006 | Kurita et al. | |
| 2010/0170435 A1* | 7/2010 | Franken | C23C 16/4584 |
| | | | 118/666 |
| 2010/0248397 A1 | 9/2010 | Newman et al. | |
| 2011/0052833 A1* | 3/2011 | Hanawa | C23C 16/4404 |
| | | | 427/534 |
| 2011/0236599 A1 | 9/2011 | Furuta et al. | |
| 2012/0321788 A1* | 12/2012 | Yang | C23C 16/45502 |
| | | | 427/255.5 |

OTHER PUBLICATIONS

PCT International Preliminary Report on Patentability in PCT/US2014/017399, mailed Sep. 3, 2015, 8 pages.
PCT International Search Report and Written Opinion in PCT/US2014/017399, mailed Jun. 3, 2014, 11 pages.

* cited by examiner

APPARATUS AND METHODS FOR INJECTOR TO SUBSTRATE GAP CONTROL

CROSS-REFERENCE TO RELATED APPLICATIONS

This application is a National Phase entry under 35 U.S.C. §371 of International Application No. PCT/US2014/017399, filed Feb. 20, 2014, which claims priority to U.S. Provisional Application No. 61/767,777, filed Feb. 21, 2013, the entire disclosures of which are hereby incorporated by reference herein.

BACKGROUND

Embodiments of the invention generally relate to apparatus and methods of processing a substrate. In particular, embodiments of the invention are directed to apparatus and methods of controlling the gap between the injector assembly and the substrates during processing.

For spatial based atomic layer deposition (ALD), the gap between the chemical injector and the product substrate must be kept between 0.1 and 2 mm for proper separation of the reactive precursors. As the size of the process chambers increases to adopt larger substrates sizes and larger batch loads, the desired gap becomes more difficult to control.

Therefore, there is a need in the art for methods and apparatus capable of maintaining a tightly controlled gap during spatial atomic layer deposition.

SUMMARY

Embodiments of the invention are directed to processing chambers comprising a gas distribution assembly, a susceptor assembly and at least one actuator. The susceptor assembly is positioned below the gas distribution assembly and includes a top surface, a bottom surface, an inner diameter region and an outer diameter region. The at least one actuator is positioned below the susceptor to push the susceptor toward the gas distribution assembly.

In some embodiments, the top surface of the susceptor assembly comprises at least one recess to support an edge of a wafer. In one or more embodiments, the recess in the top surface of the susceptor assembly is sized so that a wafer supported in the recess has a top surface substantially coplanar with the top surface of the susceptor assembly.

In one or more embodiments, each of the at least on actuators includes a bearing on top of the actuator to contact the bottom surface of the susceptor assembly. In some embodiments, the bearing is a mechanical type bearing which makes physical contact with the bottom surface of the susceptor assembly. In some embodiments, the bearing is a non-contact fluid type bearing in which only a fluid makes contact with the bottom surface of the susceptor assembly.

In some embodiments, the gas distribution assembly further comprises a reference pad opposed to the bearing on the actuator. One or more embodiments further comprise a sensor to measure the contact pressure between the susceptor assembly and the gas distribution assembly. Some embodiments further comprise a feedback circuit in communication with the sensor and the actuators.

In some embodiments, the susceptor assembly further comprises an edge ring about the outer periphery of the susceptor assembly and the actuators and bearings are positioned to contact the edge ring. In one or more embodiments, the susceptor assembly further comprises a support ring about the inner periphery of the susceptor assembly.

Some embodiments further comprise at least one actuator and bearing positioned to contact the support ring near the inner diameter region.

In some embodiments, wherein there are at least three actuators and bearings positioned about the outer diameter region of the susceptor assembly.

One or more embodiments further comprise a heating assembly below the susceptor assembly. In some embodiments, the heating assembly comprises a plurality of lamps directing radiant energy toward the bottom surface of the susceptor assembly.

Additional embodiments of the invention are directed to processing chambers comprising a gas distribution assembly and a susceptor assembly below the gas distribution assembly. The susceptor assembly includes a top surface, a bottom surface, an inner diameter region and an outer diameter region. The top surface comprises at least one recess to support an edge of a wafer and at least one channel in fluid communication with the recess to provide a flow of gas in a bottom portion of the recess so that when a wafer is in the recess, the flow of gas creates a fluid bearing to push the wafer toward the gas distribution assembly.

In some embodiments, the gas distribution assembly further comprises a channel to direct a flow of gas radially so that when a wafer is present in the recess, the radial flow of gas creates a fluid bearing above the wafer in addition to the fluid bearing below the wafer.

Further embodiments of the invention are directed to methods of processing a wafer in a processing chamber. A wafer is positioned in a recess in a top surface of a susceptor assembly, the wafer having a top surface and a bottom surface. Upwardly directed force is provided to the susceptor assembly using at least one actuator positioned below the susceptor assembly to lift the susceptor assembly toward a gas distribution assembly to set a gap between the top surface of the susceptor assembly and the gas distribution assembly. The wafer and susceptor assembly are passed under the gas distribution assembly comprising a plurality of substantially parallel gas channels directing flows of gases toward the top surface of the susceptor assembly.

Some embodiments further comprise using a sensor to measure contact pressure between the susceptor assembly and the gas distribution assembly, the pressure correlating to a gap distance.

In some embodiments, the upwardly directed force is applied to the susceptor assembly at an outer diameter region of the susceptor assembly. In one or more embodiments, the upwardly directed force is applied to an edge ring positioned at the outer peripheral region of the susceptor assembly.

In some embodiments, the upwardly directed force is applied to the susceptor assembly at an outer diameter region and an inner diameter region of the susceptor assembly. In one or more embodiments, the upwardly directed force is applied to an edge ring positioned at the outer peripheral region of the susceptor assembly and to a support ring position at the inner peripheral region of the susceptor assembly.

Additional embodiments of the invention are directed to methods of processing a wafer in a processing chamber. A wafer is positioned in a recess in a top surface of a susceptor assembly, the wafer having a top surface and a bottom surface. A fluid is flowed through the recess beneath the wafer to create a fluid bearing providing upwardly directed force to the wafer to lift the wafer toward a gas distribution assembly to set a gap between the top surface of the wafer and the gas distribution assembly.

Some embodiments further comprise flowing a fluid across a top surface of the wafer to create a fluid bearing above and below the wafer to control the size of the gap.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
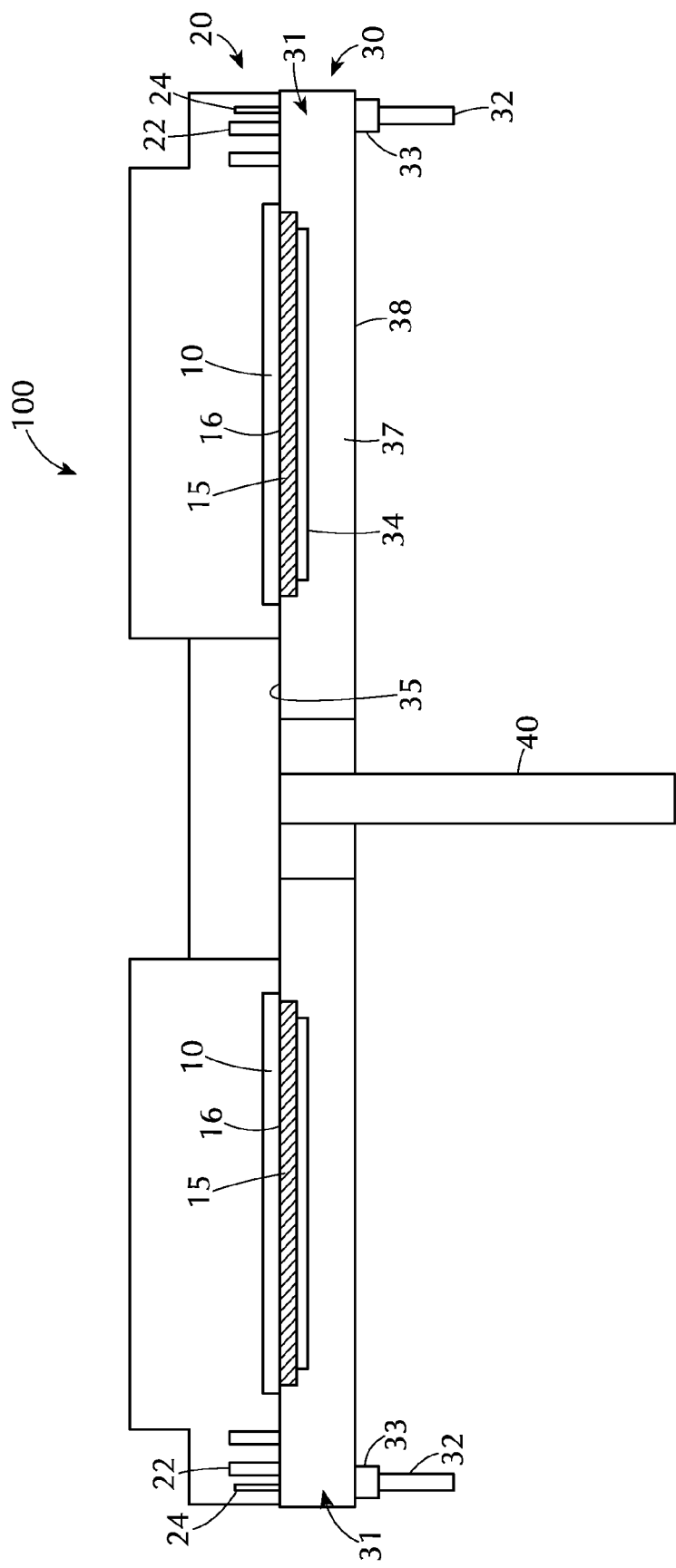
FIG. 1 shows a cross-sectional view of a processing chamber in accordance with one or more embodiments of the invention.

Embodiments of the invention are directed to apparatus and methods for controlling the gap between the injector assembly and substrate. As used in this specification and the appended claims, the terms "wafer", "substrate" and the like are used interchangeably. In some embodiments, the wafer is a rigid, discrete substrate.

In some embodiments, a rotating susceptor is assumed to be a rigid body with vertical actuators placed at the outer diameter of the susceptor. The actuators apply pressure against a bearing which pushes the susceptor against the injectors above. Each injector has reference pads with an opposing bearing. As the pressure is applied to actuators the gap closes against the injector pads until a predetermined force is reached correlating to a gap distance In one or more embodiments, the bearings confining the susceptor are mechanical type which make physical contact with the rationing susceptor surface. In some embodiments, the bearings are non-contact fluid type with only fluid making contact with the susceptor In some embodiments, the susceptor is not a rigid body, so actuators with a bearing are placed at the outer diameter and inner diameter of the susceptor. The injectors assembly has reference pads with an opposing bearing at both the inner diameter and outer diameter. As the pressure is applied to the actuators, the gap closes against the injector pads until a predetermined force is reached correlating to a gap distance.

In one or more embodiments, a support structure holds the susceptor assembly while fluid is injected between the support structure and the susceptor forming a fluid bearing across the surface of the susceptor this controls the gap between the susceptor and injector assembly above. The injectors above the susceptor are fixed with a reference pad having an opposing bearing until a predetermined force is reached which correlates to a gap distance.

In some embodiments, the injectors assembly above the susceptor is not fixed but has fluid injected along internal radial channels of the injector facing the susceptor. This forms a fluid bearing where pressure is applied until a predetermined force is reached which correlates to a gap distance.

The specific type of gas distribution assembly used can vary depending on the particular process being used. Embodiments of the invention can be used with any type of processing system where the control of the gap between the susceptor and the gas distribution assembly is controlled. While various types of gas distribution assemblies can be employed (e.g., showerheads), embodiments of the invention may be particularly useful with spatial ALD gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. The plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface 121 of the wafer 120. Some of the gas flow moves horizontally across the surface of the wafer and out of the processing region through the purge gas P channel(s). A substrate moving from one end of the gas distribution assembly to the other end will be exposed to each of the process gases in turn, thereby forming a layer on the substrate surface.

FIG. 1 shows an embodiment of a processing chamber 100 including a gas distribution assembly, also referred to as the injectors 20, and a susceptor assembly 30. In this embodiment, the susceptor assembly 30 is a rigid body. The rigid body of some embodiments has a droop tolerance no larger than 0.05 mm. Actuators 32 with a bearing are placed, for example, at three locations at the outer diameter region 31 of the susceptor assembly 30. As used in this specification and the appended claims, the terms "outer diameter" and "inner diameter" refer to regions near the outer peripheral edge and the inner edge, respectively. The outer diameter is not to a specific position at the extreme outer edge of the susceptor assembly 30, but is a region near the outer edge of the susceptor assembly 30. This can be seen in FIG. 1 from the placement of the actuators 32. The number of actuators 32 and bearings 33 can vary from one to however many will fit within the physical space available. Some embodiments have two, three, four or five sets of actuators 32 and bearings 33 positioned in the outer diameter region 31.

Once pressure is applied to the susceptor assembly 30 from the actuators 32, the susceptor assembly 30 pushes against the injectors 20 above. The injectors 20 are fixed in position and have reference pads 22 with an opposing bearing. As the pressure is applied by the actuators 32, the gap 10 closes until a predetermined force is reached correlating to a gap distance. In some embodiments, the gap distance is in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The susceptor assembly 30 is positioned beneath the gas distribution assembly 20. The susceptor assembly 30 includes a top surface 35 and, optionally, at least one recess 34 in the top surface 35. The recess 34 can be any suitable shape and size depending on the shape and size of the wafers 15 being processed. In the embodiment shown, the recess 34 has two step regions around the outer peripheral edge of the recess 34. These steps can be sized to support the outer peripheral edge of the wafer 15. The amount of the outer peripheral edge of the wafer 15 that is supported by the steps can vary depending on, for example, the thickness of the wafer and the presence of features already present on the back side of the wafer.

In some embodiments, as shown in FIG. 1, the recess 34 in the top surface 35 of the susceptor assembly 30 is sized so that a wafer 15 supported in the recess 34 has a top surface 16 substantially coplanar with the top surface 35 of the susceptor 37. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 30 of FIG. 1 includes a support post 40 which is capable of lifting, lowering and rotating the susceptor assembly 30. The susceptor assembly may include a heater, or gas lines, or electrical components within the center of the support post 40. The support post 40 may be the primary means of increasing or decreasing the gap between the susceptor assembly 30 and the injectors 20, moving the susceptor assembly 30 into rough position. The actuators 32 can then make micro-adjustments to the position of the susceptor assembly to create the desired gap.

The gas distribution assembly 20 may also include one or more sensors 24. The sensors 24 are located in a position corresponding to the actuators 32 and bearings 33 that push on the susceptor assembly 30. The sensors 24 can be configured to measure, for example, pressure applied to the front surface of the injectors from the susceptor assembly 30. The sensors can be connected to a feedback circuit (not shown) which, upon determining that the pressure has met a predetermined condition, can stop the movement of the actuators 32 to avoid damaging or crushing the susceptor assembly 30 against the gas distribution assembly 20.

Figure 2:
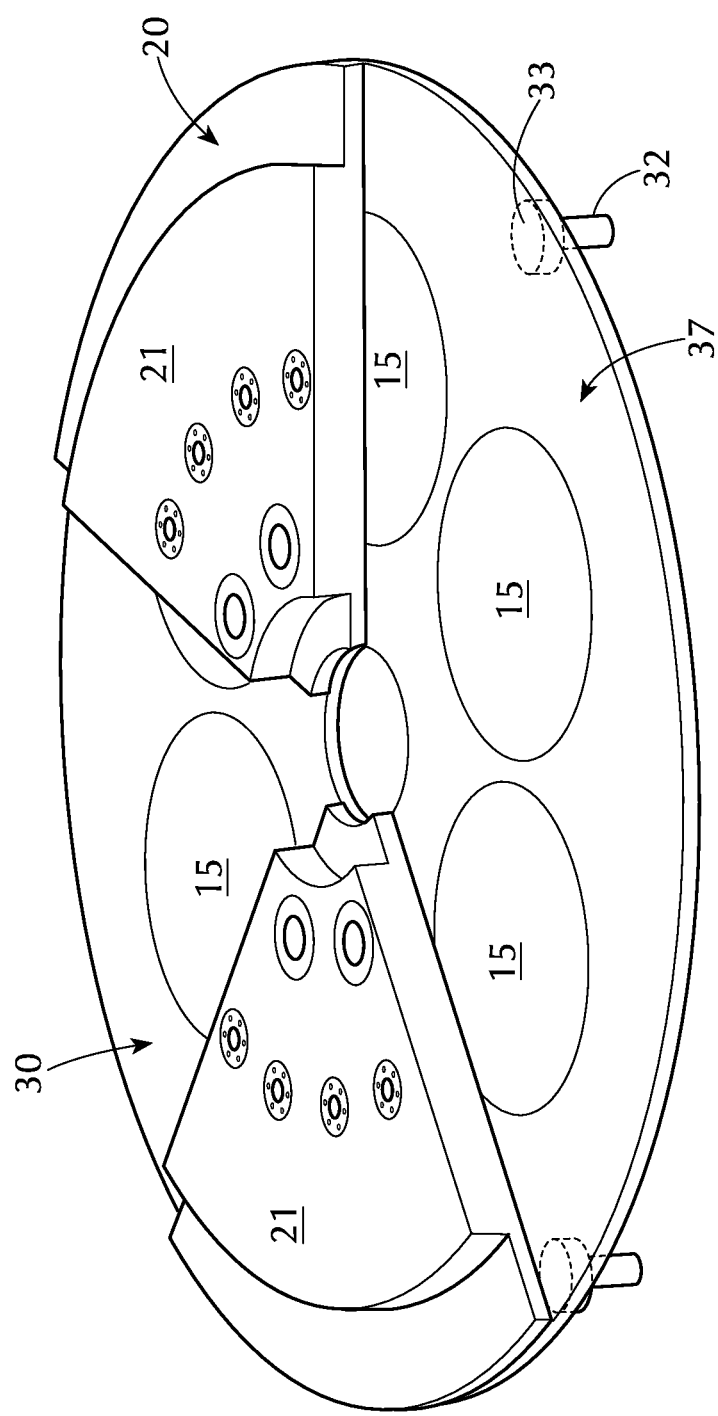
FIG. 2 shows a perspective view of a susceptor assembly and gas distribution assembly in accordance with one or more embodiments of the invention.

The processing chamber 100 shown in FIG. 1 is a carousel-type chamber in which the susceptor assembly 30 can hold a plurality of wafers 15. The gas distribution assembly 20 may include a plurality of separate injector units 21, each injector unit 21 being capable of depositing a film on the wafer, as the wafer is moved beneath the injector unit. FIG. 2 shows a perspective view of a carousel-type processing chamber. Two pie-shaped injector units 21 are shown positioned on approximately opposite sides of and above the susceptor assembly 20. This number of injector units 21 is shown for illustrative purposes only. It will be understood that more or less injector units 21 can be included. In some embodiments, there are a sufficient number of pie-shaped injector units 21 assembly to form a shape conforming to the shape of the susceptor assembly. In some embodiments, each of the individual pie-shaped injector units 21 may be independently moved, removed and/or replaced without affecting any of the other injector units 21. For example, one segment may be raised to permit a robot to access the region between the susceptor assembly 30 and gas distribution assembly 20 to load/unload wafers 15.

The actuators 32, and bearings 33, can contact the susceptor assembly, or susceptor ring, depending on the specific susceptor assembly 30 being used. Referring to FIG. 2, the actuator 32 with bearings 33 make contact with and directly push on the susceptor 37 holding the wafers 15, as shown in FIG. 2.

Figure 3:
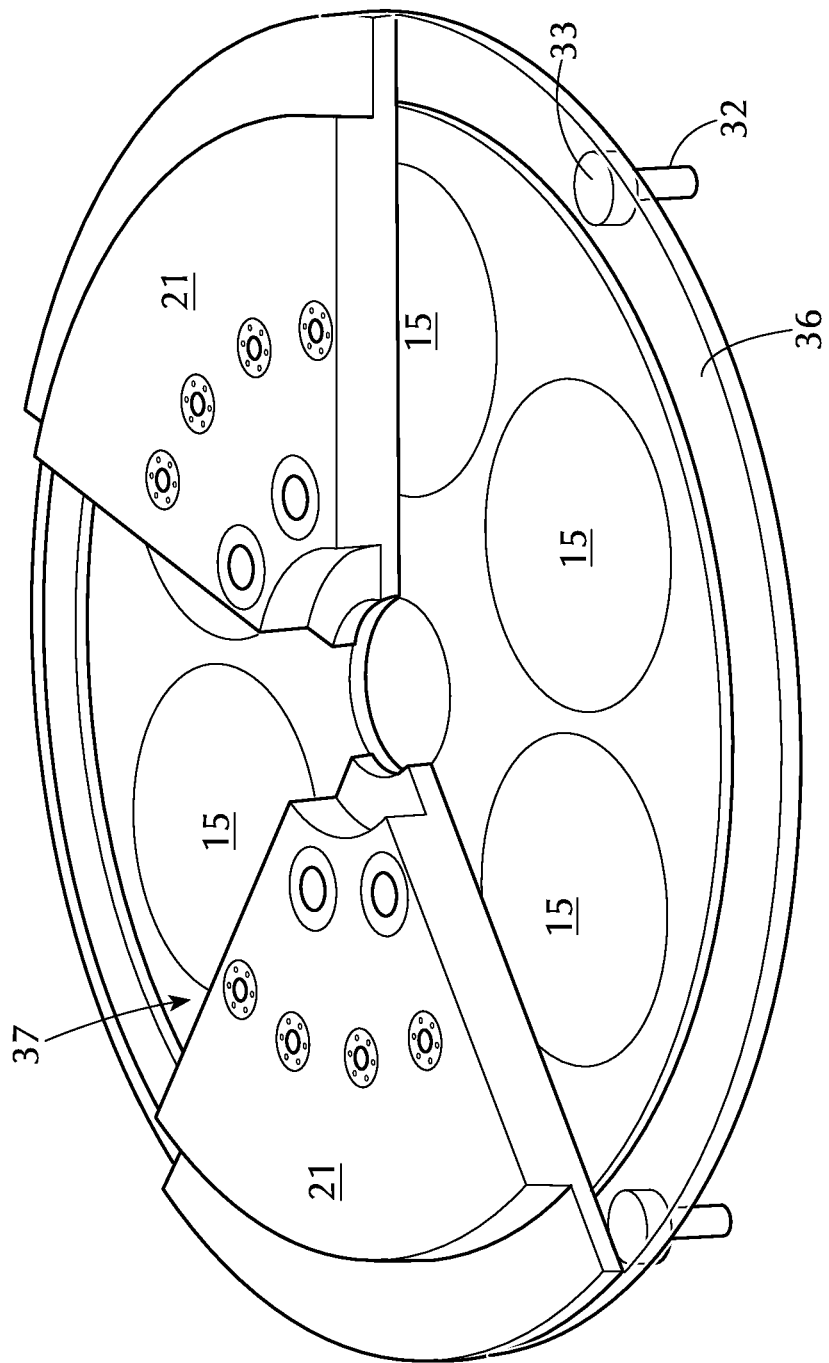
FIG. 3 shows a perspective view of a susceptor assembly and gas distribution assembly in accordance with one or more embodiments of the invention.

In some embodiments, as shown in FIG. 3, the susceptor assembly 30 includes an edge ring 36 which surrounds the susceptor 37. The edge ring 36 can be made of any suitable material including, but not limited to, quartz. As shown, the bearings 33 can push directly on the edge ring 36 instead of the susceptor 37. The edge ring 36 acts as a support structure holding the susceptor 37 to create a thermal barrier between the bearing 33 and the susceptor 37.

The bearing 33 can be any suitable bearing including. In some embodiments, the bearings 33 contacting the susceptor 37 are mechanical. Bearings 33 of this type make physical contact with the susceptor 37 or edge ring 36 surface. In these embodiments, the bearings 33 can rotate, or make a suitably low friction contact, with the rotation of the susceptor assembly 30 so that the pressure applied to the susceptor assembly 30, and the gap 10 can be maintained throughout processing.

In some embodiments, the bearings 33 are non-contact fluid type bearings. In these embodiments, only the fluid (e.g., an inert gas) makes contact with the rotating surface of the susceptor assembly 30. This provides a nearly frictionless bearing interface with the bottom surface 38 of the susceptor assembly 30 and allows the susceptor assembly 30 to rotate during processing without changing the size of the gap 10.

Figure 4:
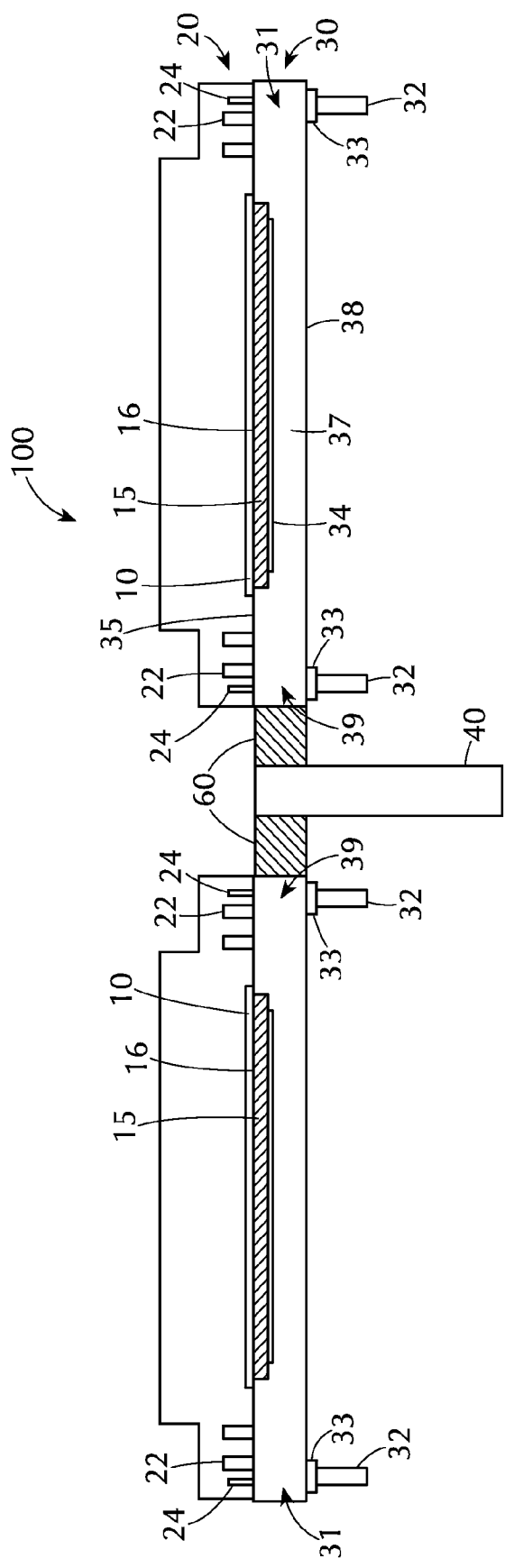
FIG. 4 shows a cross-sectional view of a processing chamber in accordance with one or more embodiments of the invention.

FIG. 4 shows another embodiment of the invention in which the susceptor assembly 30 is not a rigid body. In some embodiments, the susceptor assembly 30 has a droop tolerance of not more than about 0.1 mm, or not more than about 0.05 mm, or not more than about 0.025 mm, or not more than about 0.01 mm. Here, there are actuators 32 with bearings 33 placed at the outer diameter region 31 and at the inner diameter region 39 of the susceptor 37. The actuators 32 with bearings 33 can be positioned at any suitable number of places around the inner and outer periphery of the susceptor assembly. In some embodiments, the actuators 32 and bearings 33 are placed at three locations at both the outer diameter region 31 and the inner diameter region 39. The actuators 32 and bearings 33 at both the outer dimension region 31 and the inner dimension region 39 apply pressure to the susceptor assembly 30 which pushes the susceptor 37 against the injectors 20 above. The injectors 20 are fixed in position and have reference pads 22 with an opposing bearing aligned with both the outer diameter region 31 and inner diameter region 39, as shown in FIG. 4. There may also be sensors 24 positioned near the reference pads 22. As pressure is applied to the actuators 32 and bearings 33, the gap 10 closes until a predetermined force is reached correlating to a desired gap distance.

Figure 5:
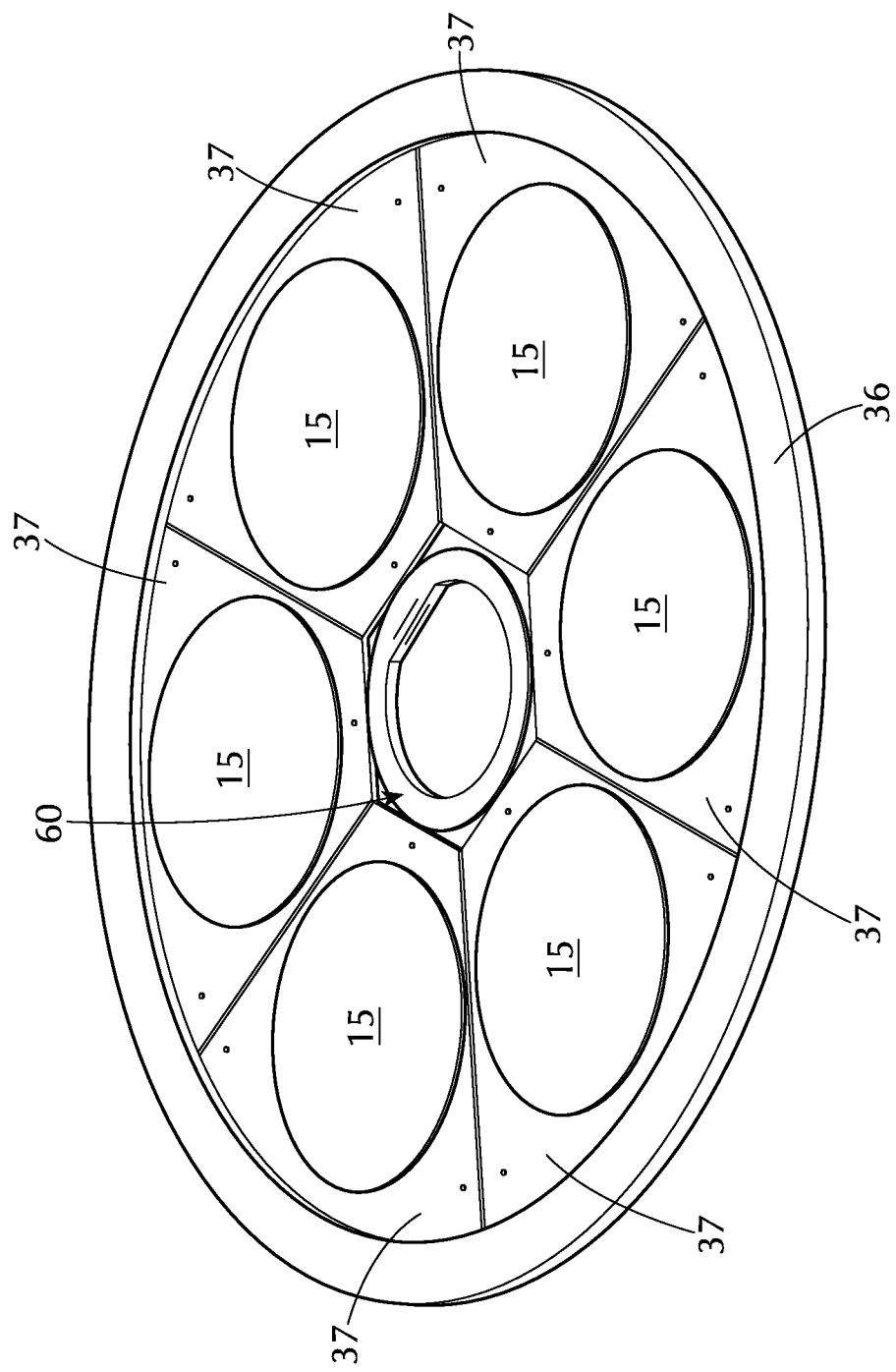
FIG. 5 shows a perspective view of a susceptor assembly with a plurality of pie-shaped susceptor segments in accordance with one or more embodiments of the invention.

The susceptor assembly 30 may include an inner support 60 positioned at the inner periphery of the susceptor 37, as shown in FIG. 5. The bearing 33 pushes on the inner support 60 structure. The inner support 60 can be made of a thermally insulating material, such as quartz, which holds the susceptor 37 to create a thermal break from the susceptor 37 to the bearings 33 at the outer diameter region 31 and the inner diameter region 39. The region of the support structure beneath the susceptors 37 may be transparent to IR radiation so incident radiation from a heater source (not shown) positioned below the susceptor assembly 30 can transmit to the susceptor 37. Again, the bearings 33 can be mechanical, making physical contact with the susceptor surface, or non-contact fluid types.

In the embodiment shown in FIG. 5, the susceptor assembly 30 includes a plurality (in this case there are six) separate pie-shaped susceptor segments. Each of these segments can be independently leveled on the susceptor, moved, removed and/or replaced without affecting the other segments. For example, one segment may be lowered to allow a wafer to be loaded/unloaded.

Figure 6:
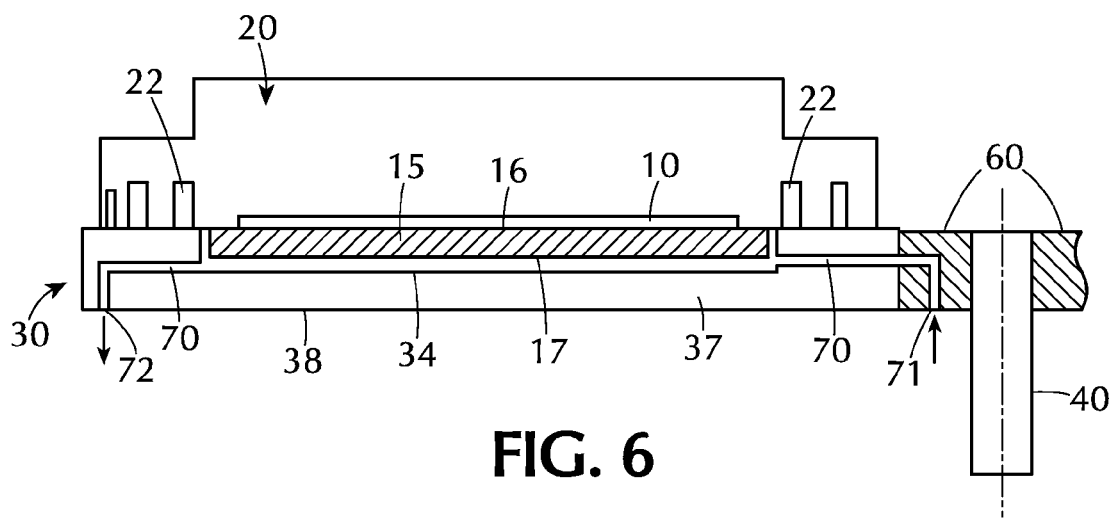
FIG. 6 shows a partial cross-sectional view of a processing susceptor assembly and gas distribution assembly in accordance with one or more embodiments.

FIG. 6 shows another embodiment of the invention in which a support structure 60 holds a susceptor 37 while fluid (e.g., gas) is injected between the support structure 60 and the susceptor 37. The gas enters the susceptor assembly 30 through an inlet 71 in the bottom surface of the support structure 60, although the gas could enter through another path. The gas flows through the conduit 70 to the recess 34 where it flows across the back side 17 of the wafer 15 and out of the recess 34 through conduit 70 to outlet 72. The pressure of the gas flowing across the back side 17 of the wafer 15 forces the wafer against the injectors 20. This gas flow forms a fluid bearing across the under surface of the wafer 15 which can be used to control the gap 10 between the susceptor 37 and injector assembly 20 above. The injectors 20 above the susceptor 37 may be fixed with reference pads 22 having an opposing bearing until a predetermined force is reached which correlates to a gap distance.

While the conduit 70 is shown starting and ending at the back surface 38 of the susceptor 37, either the inlet 71 or outlet 72 can be located in other positions. For example, the inlet may be directed through the support post 40 of the susceptor assembly 30.

The gas flow through the conduit 70 can be controlled by a number of methods. The pressure of the gas entering the inlet 71 of the conduit 70 can be controlled. The diameter of the conduit 70 at the outlet 72 can be different from the inlet 71 diameter, and can be a fixed diameter or dynamic using an iris type aperture.

Figure 7:
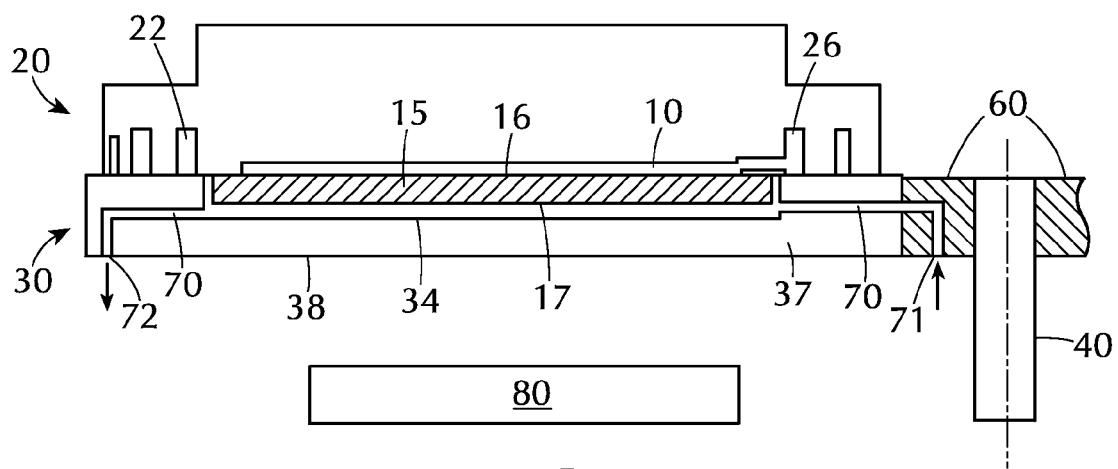
FIG. 7 shows a partial cross-sectional view of a processing susceptor assembly and gas distribution assembly in accordance with one or more embodiments.

FIG. 7 shows another embodiment of the invention in which the gas distribution assembly 20 is not in fixed position. The injector assembly 20 has gas channel 26 to inject a gas radially across the top surface 16 of the wafer 15. The radially injected gas forms a large surface fluid bearing until a predetermined force is reached which correlates to a gap 10. In some embodiments, a fluid bearing is created above the wafer and below the wafer by flowing gases radially 26 across the top surface 16 and through the conduit 70 in the susceptor 37 across the bottom surface 17. The combined fluid bearings can be fine-tuned to provide the proper amount of pressure to create the desired gap 10.

In some embodiments, as shown in FIG. 7, the processing chamber 100 includes a heating assembly 80. The heating assembly 80 can be positioned in any suitable location within the processing chamber including, but not limited to, below the susceptor assembly 30 and/or on the opposite side of the susceptor assembly 30 than the gas distribution assembly 20. The heating assembly 80 provides sufficient heat to the processing chamber to elevate the temperature of the wafer 15 to temperatures useful in the process. Suitable heating assemblies 80 include, but are not limited to, resistive heaters and radiant heaters (e.g., a plurality of lamps) which direct radiant energy toward the bottom surface 38 of the susceptor assembly 30.

Embodiments of the invention may be of particular use in carousel-type processing chambers in which the wafers are offset from and rotated about a central axis. This can be seen in FIGS. 2 and 3. The centrifugal force associated with the rotation of the susceptor assembly can cause the wafer to slide away from the central axis. The gas channels of the gas distribution assembly can be controlled simultaneously (e.g., all of the output channels—reactive gases and purge channels—controlled together), in groups (e.g., all of the first reactive gas channels controlled together) or independently (e.g., the left-most channel controlled separately from the adjacent channel, etc.). As used in this specification and the appended claims, the term "output channels" "gas channels", "gas injectors" and the like are used interchangeably to mean a slot, channel or nozzle type opening through which a gas is injected into the processing chamber. In some embodiments, the first reactive gas channel, the second reactive gas channel and the at least one purge gas channel are independently controlled. Independent control may be useful to provide a positive pressure on the top surface of the wafer positioned in the recess of the susceptor assembly. In some embodiments, each individual first reactive gas injector, second reactive gas injector, purge gas injector and pump channel can be individually and independently controlled.

Some embodiments of the invention are directed to methods of processing a wafer. The wafer is positioned in a recess in a top surface of the susceptor assembly. A upwardly directed force is applied to the bottom surface of the susceptor assembly with a plurality of actuators to move the susceptor assembly into contact with a gas distribution assembly.

In some embodiments, a sensor in the gas distribution assembly measures the pressure or compressive force between the susceptor assembly and the gas distribution assembly. The sensor can be in communication with a feedback circuit which can also be in contact with the actuators. The feedback circuit can provide instructions to the actuator to apply more upward pressure, less upward pressure, or maintain the current upward pressure to create a gap of the appropriate size.

In some embodiments, instead of actuators, a gas stream is flowed across the bottom surface of the wafer while the wafer is in the recess of the susceptor assembly. The gas stream can create a fluid bearing beneath the wafer forcing the wafer upward to rest against the gas distribution assembly.

In one or more embodiments, a fluid bearing is created above the wafer in addition to the fluid bearing beneath the wafer. The pressure applied to the top surface and bottom surface of the wafer can be tuned by changing the strength or magnitude of the fluid bearings. Adjustment of the pressures can push the wafer to rest against the gas distribution assembly creating the proper gap. In some embodiments, the fluid bearing created above the wafer is created by flowing a gas across the surface, in a radial direction. The gas flowing across the surface can be flowed through the gas distribution assembly or through an auxiliary line.

Substrates for use with the embodiments of the invention can be any suitable substrate. In detailed embodiments, the substrate is a rigid, discrete, generally planar substrate. As used in this specification and the appended claims, the term "discrete" when referring to a substrate means that the substrate has a fixed dimension. The substrate of specific embodiments is a semiconductor wafer, such as a 200 mm or 300 mm diameter silicon wafer.

As used in this specification and the appended claims, the terms "reactive gas", "reactive precursor", "first precursor", "second precursor" and the like, refer to gases and gaseous species capable of reacting with a substrate surface or a layer on the substrate surface.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be required. Indeed, other embodiments relate to deposition processes under very mild conditions without plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus are disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A processing chamber comprising:
   a gas distribution assembly having a front surface;
   a susceptor assembly below the gas distribution assembly, the susceptor assembly including a top surface, a bottom surface, an inner diameter region and an outer diameter region, the top surface spaced from the front surface of the gas distribution assembly to form a gap, the susceptor assembly including a support post capable of lifting, lowering and rotating the susceptor assembly; and
   at least one actuator positioned below the susceptor assembly at the outer diameter region to push the susceptor assembly upward toward the gas distribution assembly to change the gap between the gas distribution assembly and the susceptor assembly, each of the at least one actuators includes a bearing on a top of the actuator to contact the bottom surface of the susceptor assembly.

2. The processing chamber of claim 1, wherein the bearing is one or more of a mechanical type bearing which makes physical contact with the bottom surface of the susceptor assembly or a non-contact fluid type bearing in which only a fluid makes contact with the bottom surface of the susceptor assembly.

3. The processing chamber of claim 2, wherein the gas distribution assembly further comprises a reference pad opposed to the bearing on the actuator.

4. The processing chamber of claim 3, further comprising a contact pressure sensor to measure a contact pressure between the susceptor assembly and the gas distribution assembly, the contact pressure sensor located on the gas distribution assembly and in a position corresponding to an actuator, and an optional feedback circuit in communication with the contact pressure sensor and the actuators.

5. The processing chamber of claim 1, wherein the susceptor assembly further comprises an edge ring about the outer periphery of the susceptor assembly and the actuators and bearings are positioned to contact the edge ring.

6. The processing chamber of claim 5, wherein the susceptor assembly further comprises a support ring about the inner periphery of the susceptor assembly and, optionally, at least one actuator and bearing positioned to contact the support ring near the inner diameter region.

7. A processing chamber comprising:
   a gas distribution assembly having a front surface;
   a susceptor assembly below the gas distribution assembly, the susceptor assembly including a top surface spaced from the front surface of the gas distribution assembly to form a gap, a bottom surface, an inner diameter region and an outer diameter region, the top surface comprising at least one recess to support an edge of a wafer and at least one channel in fluid communication with the recess to provide a flow of gas in a bottom portion of the recess so that when a wafer is in the recess, the flow of gas creates a fluid bearing to push the wafer upward toward the gas distribution assembly, wherein the gas distribution assembly further comprises a channel to direct a flow of gas radially so that when a wafer is present in the recess, the radial flow of gas creates a fluid bearing above the wafer in addition to the fluid bearing below the wafer; and
   at least one actuator positioned below the susceptor assembly at the outer diameter region to push the susceptor assembly upward toward the gas distribution assembly to change the gap between the gas distribution assembly and the susceptor assembly, each of the at least one actuators includes a bearing on a top of the actuator to contact the bottom surface of the susceptor assembly.

* * * * *